United States Patent [19]

Chatterjee et al.

[11] Patent Number: 4,824,481

[45] Date of Patent: Apr. 25, 1989

[54] SPUTTERING TARGETS FOR MAGNETO-OPTIC FILMS AND A METHOD FOR MAKING

[75] Inventors: Dilip K. Chatterjee, Rochester, N.Y.; Srinivas T. Rao, Los Gatos, Calif.

[73] Assignee: Eaastman Kodak Company, Rochester, N.Y.

[21] Appl. No.: 142,363

[22] Filed: Jan. 11, 1988

[51] Int. Cl.$^4$ ............................................. B22F 1/00
[52] U.S. Cl. .................................... 75/246; 204/292; 419/23; 419/31; 419/33; 419/48; 419/57; 419/60
[58] Field of Search ................. 204/292; 75/246; 419/23, 33, 31, 48, 57, 60

[56] References Cited

U.S. PATENT DOCUMENTS

| | | | |
|---|---|---|---|
| 3,949,387 | 4/1976 | Chaudhari et al. | 340/174 |
| 4,135,286 | 1/1979 | Wright et al. | 75/226 |
| 4,402,770 | 9/1983 | Koon | 148/31.57 |
| 4,619,697 | 10/1986 | Hijikata et al. | 419/23 |
| 4,620,872 | 4/1986 | Hijikata | 75/246 |
| 4,647,548 | 3/1987 | Klein | 501/134 |
| 4,670,353 | 6/1987 | Sakurai | 428/606 |
| 4,752,335 | 6/1988 | Korb | 75/249 |
| 4,770,702 | 9/1988 | Ishigaki et al. | 75/244 |

FOREIGN PATENT DOCUMENTS

| | | |
|---|---|---|
| 60-131693 | 7/1985 | Japan . |
| 60-230903 | 11/1985 | Japan . |
| 61-060803 | 3/1986 | Japan . |
| 61-091336 | 5/1986 | Japan . |
| 61-168222 | 5/1986 | Japan . |
| 61-139637 | 6/1986 | Japan . |
| 61-178474 | 8/1986 | Japan . |
| 62-020864 | 1/1987 | Japan . |
| 62-014349 | 1/1987 | Japan . |
| 62-045461 | 2/1987 | Japan . |
| 62-056543 | 3/1987 | Japan . |
| 62-056353 | 3/1987 | Japan . |
| 62-054001 | 3/1987 | Japan . |
| 62-047475 | 3/1987 | Japan . |
| 62-070550 | 4/1987 | Japan . |
| 62-086159 | 4/1987 | Japan . |

OTHER PUBLICATIONS

Jayaraman et al, "Microstructures in Rapidly Solidified Ni–Mo Alloy", ASM, 1985.
Vossen, J. L., "J. Vac. Sci. Technol.", vol. 8, No. 6, 751–751 (1971).

*Primary Examiner*—Stephen J. Lechert, Jr.
*Attorney, Agent, or Firm*—Robert A. Gerlach

[57] ABSTRACT

Sputtering targets are made by melting at least one rare earth and at least one transition metal to produce an amorphous alloy melt, forming a powder of the alloy in an oxygen free atmosphere, introducing the powdered alloy into a reducing mold, adding a layer of powdered oxygen-getter on top of the powdered alloy, and hot pressing the alloy.

19 Claims, No Drawings

SPUTTERING TARGETS FOR MAGNETO-OPTIC FILMS AND A METHOD FOR MAKING

BACKGROUND OF THE INVENTION

This invention relates to sputtering targets useful for making magneto-optical films and, more particularly, to a unique method for preparing rare earth-transition metal targets for producing magneto-optical thin film recording materials.

Sputtering is widely accepted as the most practical method for generating magneto-optical film, making the availability of suitable target materials critical to the success of this technology. Generally, targets are prepared in one of three ways. In one process, an alloy is produced by melting two dissimilar metals in an electric arc furnace in vacuo or in an inert gas atmosphere. In a second process, an alloy is produced by incorporating rare earth metal chips into a transition metal sheet or transition metal chips into a rare earth metal sheet. A third process involves producing an alloy ingot, generally by arc melting and reducing the ingot to fine particles which are then hot pressed to form the target.

These processes and the targets produced by them have certain disadvantages. For example, the first method tends to segregate trace elements during arc melting. The alloy product can have residual cavities and casting defects and, because it is brittle, the alloy cannot be forged, heat treated, or subjected to other processes conventionally used to provide homogeneity. The size of the target is limited by the size of the electric arc furnace as is the shape of the target, necessitating subsequent working such as cutting, grinding or milling to obtain the desired configuration. The targets produced by this process have relatively high oxygen contents so that thin films produced from them are not particularly adapted to the formation of perpendicular magnetization for magneto-optical recording. Because they tend to have low tenacities, targets produced by this method crack easily, especially under thermal shock applied during the sputtering process. This characteristic is associated with rate of cooling, microstructure, and internal stress. Slow cooled castings can show large grains and phase segregation.

The second process can provide abnormal discharge between the sheet and chip materials and non-homogeniety in the alloy. Trace alloying elements on the sheet can make it difficult to obtain a film of uniform composition and, like the targets produced by the first method, the deposition rate obtained by sputtering in a magnetron, for example, is relatively slow.

The main problem with the third process is that the target material is made from a powder of an intermetallic and tends to be brittle. Oxides also tend to form on the powder surface so that the product can have a higher oxygen content than targets produced by the first two methods.

SUMMARY OF THE INVENTION

It is therefore an object of this invention to provide a sputtering target for making magneto-optical films for media manufacturing as well as for generating magnetic thin films and a process for producing such target which is devoid of the foregoing disadvantages.

Another object of the invention is to provide a process for producing dense sputtering targets which have no cracks and which can be of any shape or size.

A further object of the invention is to provide a homogeneous suttering target that can be used at high temperatures without oxidation of the rare earth-transition metal target alloy.

Yet another object of the invention is to provide a process for producing a target material having high density, strength, and the tenacity to withstand thermal shock during handling and sputtering, as well as an oxygen content low enough to enable rapid formation by sputtering of a perpendicular magnetization film suitable for use in magneto-optical recording.

The foregoing objects and others which will become apparent from the following description are accomplished in accordance with this invention, generally speaking, by providing rare earth-transition metal target materials by a process which comprises heating at least one rare earth metal and at least one transition metal to produce an amorphous alloy melt, forming a powder of the amorphous alloy in an oxygen-free atmosphere, introducing the powdered alloy into a reducing mold, adding a layer of a powdered oxygen-getter on top of the powdered alloy, and hot pressing the alloy. The entire process is preferably carried out in an oxygen-free atmosphere.

Preferably, the alloy is generated by induction melting the rare earth-transition metals and the resulting melt is melt-spun in accordance with the procedure described in U.S. Pat. No. 4,402,770, the disclosure of which is hereby incorporated by reference, to solidify it quickly. Rapidly solidified alloys exhibit a greatly refined microstructure, extended solid solubility and the metastable phase formation important for the production of good magneto-optical film products. The extrudate or ribbon of rapidly cooled alloy is preferably crushed to a fine powder before it is poured into the reducing mold and covered with a layer of oxygen gettering powdered material, preferably titanium. As used herein, the term reducing mold refers to a mold constructed of, or preferably lined with, a material that is reducing in nature such as a graphite foil (grafoil) film.

The product of the process is a compact homogeneous target devoid of cracks which may have any size or configuration suitable for use in any suitable sputtering process to generate magneto-optical films for media manufacturing and also to generate magnetic thin films.

DETAILED DESCRIPTION OF THE INVENTION

The initial alloy of the rare earth-transition metal starting materials can be prepared by any of the suitable alloying methods known in the art. Preferably, however, the alloy is made by induction heating as described in U.S. Pat. No. 4,402,770, the disclosure of which has been incorporated herein by reference.

Any suitable rare earth metal such as Gd, Ce, Tb, Er, Dy, Sm, Ho, Nd, Sm, Pr, Yb, Tm, La, Y and the like and mixtures thereof and any suitable transition metal such as Fe, Co, Mn, Ni, Cr, Ta, Cu, Hf, and the like and mixtures thereof can be used to prepare the initial alloy. The starting metals should preferably have high purity, at least 99%, and low oxygen content, at most 0.4% by weight. Any suitable ratio of the rare earth metal or metals to the transition metal or metals can be employed as is known in the art depending on the desired composition of the sputtered film product. Preferably about 10 to 40 atomic % of the rare earth metal to about 90 to 60 atomic % of the transition metal is used for best recording performance. Most preferably a Tb-Fe-Co mixture is used as described in U.S. Pat. No. 4,670,353, the disclosure of which is hereby incorporated by reference. Such materials provide good results particularly in the thermomagnetic recording of information.

The initial alloy is rapidly solidified to produce a refined microstructure, extended solid solubility and a metastable phase. Any suitable method for rapid solidification can be used but it is preferred to rapidly solidify by melt-spinning the alloy to maximize uniformity in the amorphous product. Melt spinning insures that fine particles are frozen in solid solution to provide homogeneity without the segregation that occurs when casting or other cooling methods are employed. Additionally, the alloy melt can be atomized, poured into liquid nitrogen, or otherwise treated to produce a fine powder directly from the melt. Any convenient melt-spinning apparatus known in the art can be used to rapidlly solidify the alloy such as these described in U.S. Pat. No. 4,402,770, incorporated herein by reference.

Preferably, the alloy is prepared and rapidly solidified in a substantially oxygen-free atmosphere to minimize oxidation of the metals as much as possible. Any suitable inert gas known in the art that will not result in oxidation of the alloy can be used such as, for example, substantially oxygen-free argon, helium, xenon, neon and the like and mixtures thereof. An argon blanket is most preferred because of its inertness and ready availability.

If the amorphous alloy is melt-spun, the melt-spun ribbon is crushed or pulverized in an oxygen-free atmosphere such as those described above. Any suitable means can be used to crush the alloy such as, for example, a ball mill, mortar and pestle, or any other suitable apparatus known in the art.

The average amorphous alloy powder particle size preferably ranges from about 45 $\mu$m to about 250 $\mu$m. At particle sizes below about 45 $\mu$m the material tends to have an increased oxygen content because of the increased exposed surface area of the amorphous alloy, making the final film product less than optimally suitable for use as a perpendicular magnetization film for magneto-optical recording. On the other hand, if the average particle size exceeds about 250 $\mu$m, the final product tends to be less porous.

The alloy powder is then poured into a reducing mold of the appropriate dimensions, preferably in an oxygen-free atmosphere, to produce a target of the desired size and configuration. Generally, any suitable mold having a grafoil (graphite foil) lining is preferred. For example, the mold may be ceramic or a container such as a die formed of stainless steel plate, or tool steel and can be disk-shaped or rectangular or of any other configuration or material known in the art. A particularly appropriate material is an alloy made by doping molybdenum with titanium and zirconium. The grafoil lining may have any suitable size or dimension as may be practicable. A thickness of from about 250 $\mu$m to about 500 $\mu$m (10-20 mils) is preferred, although thicker or thinner films can also be used. However, if the film is too thick, it can cause creases in the product, particularly where it overlaps to prevent contact with the die. If the film is too thin it can lose its integrity and rupture.

The mold can also be made of a reducing material that can be used either with or without a grafoil lining. While solid graphite can be used, such molds are not recommended since they tend to crack during hydrostatic or hot isotactic pressing. Further, graphite molds are not suitable, particularly for multiple uses, since they erode, produce particles, and change in dimension with use. Accordingly, molds to be used without a lining are made of any reactive metals that will combine with oxygen without bleeding contaminants into the amorphous alloy or reacting with the alloy or its components under treatment conditions. Magnesium, titanium, aluminum and the like as well as oxides that will not delaminate or contaminate the target with inclusions can be employed.

A powder of an oxygen-getter is placed on top of the crushed alloy in the mold, preferably in an oxygen-free atmosphere, permitting operation at high temperatures without oxidation of the powdered rare earth-transition metal alloy when the appropriate oxygen-gettering powder is used. Any suitable powdered oxygen-getter can be used such as, for example, cerium, mish metal, magnesium, calcium, lanthanum or any rare earth metal powder, titanium, and the like and mixtures thereof. Titanium is preferred as is any metal, such as calcium, which also acts to purify rare earths because of its placement in the electromotive force series. Such materials can be sacrificed to protect the rare earth in the alloy. The size of the getter powder particles is not critical but preferably ranges from an average size of about 5 $\mu$m to 30 $\mu$m, most preferably 5-10 $\mu$m. The thickness of the oxygen-getter powder blanket is likewise not critical as long as the entire surface of the amorphous alloy powder is covered. Preferably a thickness of from about 2 to 5 mm is used. A thickness of at least about 2 mm is most preferred to insure that the oxygen-getter adequately blankets the alloy and acts as a barrier against the transport of oxygen from the atmosphere, particularly if the atmosphere does not remain oxygen-free.

To produce a target having a low oxygen content, the powder should be hot-pressed to densify it either in a vacuum or in an oxygen-free atmosphere such as those described hereinbefore. If vacuum is used, the preferred atmospheric pressure ranges from about 0.01 to about $10^{-6}$ Torr.

The temperature used for hot-pressing should be lower than the eutectic point of the system. If the mixture is hot-pressed at the eutectic point or higher, a liquid phase forms and the chance of oxidation of the metals is increased. Oxygen contents in excess of 0.5% can result. Further, the liquid phase comes out of the system under pressure and can cause potential problems.

The hot-pressing process can be carried out at any suitable pressure but is preferably conducted at a hot-press pressure of from about 1000-3500 Kg/cm$^2$, typically from about 2000 to 3000 Kg/cm$^2$.

The hot-pressing process causes plastic deformation of the metals in the mixture, partial solid phase diffusion between the metals, and subsequent formation of an intermetallic compound at the interfaces between the metals, as well as joinder thereof. As a result, high densities are achieved to produce a target material of high strength.

Hot-pressing conditions should be applied for a sufficient time to produce the phenomenon described above. The time varies with the temperature and pressure employed but is generally at least about 2 minutes. The conclusion of the hot-pressing operation can be determined by visually observing the position of the ram with respect to the mold.

Targets obtained by the practice of the invention are fully dense homogeneous, crack-free, and useful for generating magneto-optical films for media manufacture and magnetic thin films of high quality by any suitable sputtering process such as is described, for example, in U.S. Pat. No. 3,949,387, the disclosure of which is hereby incorporated by reference.

The invention is further illustrated by the following example in which all parts and percentages are by weight unless otherwise indicated.

The initial cast alloy was made in an induction furnace. 15.6 grams of pure terbium, 18.5 grams of pure iron and 1.4 grams of pure cobalt were weighed and placed in a quartz crucible coated with boron nitride. The furnace was evacuated and back filled with high purity Ar gas and this process was repeated at least twice. At the completion of the final Ar back fill step the charge was inductively coupled until molten. RF power due to its eddy current facilitates vigorous stirring and homogenizes the melt. The molten alloy was poured into a water cooled Cu mold. This initial alloy casting was broken into small pieces and placed in a quartz tube with a fine hole (~1 mm) in one end. The quartz tube is part of a melt spinner in which the alloy is inductively melted again. The working chamber of the melt-spinner is evacuated and back filled with pure Ar prior to melt spinning during which the alloy melt is ejected with Ar pressure onto a rotating Cu-Be wheel. The super-heat of the molten alloy and the wheel speed determine the cooling rate and hence the structure of the final alloy. Amorphous alloy structure or microcrystallite structure in the melt spun alloy is preferable for any later diffusion controlled process such as hot consolidation.

The melt spun alloy ribbons were crushed to about 45 $\mu$m sized powers and 20 gms of this powder were poured into a grafoil-lined mold made of molybdenum doped with titanium and zirconium for hot pressing of the TbFeCo melt spun alloy. The mold cavity had a cylindrical configuration having a diameter of 1.9 cm and 5.0 cm deep. As an oxygen-getter, 5 gms of Ti powder (5 $\mu$m size) were layered over the alloy powder in the mold.

The mold and ram assembly (with the powders in it) was then placed in the vacuum chamber of a hot pressing apparatus and the chamber was evacuated to about 0.01 Torr. The mold and die assembly was inductively heated to a temperature of 700° C., and simultaneously a pressure of 2820 Kg/cm$^2$ was applied for about 2 minutes until compaction was completed.

When the hot pressing was completed the mold and ram assembly was cooled with a flow of Ar gas, and the pressed sample was removed from the mold. The pressed sample was then ground and polished to generate a sputtering target used as described, in U.S. Pat. No. 4,670,353, the disclosure of which has been incorporated by reference, to produce an amorphous film having an axis of easy magnetization perpendicular to the film surface and a composition of $Tb_{24}Fe_{71}Co_5$.

Although the invention has been described in considerable detail in the foregoing, such detail is solely for the purpose of illustration. Variations can be made in the invention by those skilled in the art without departing from the spirit and scope of the invention except as set forth in the claims.

What is claimed is:

1. A method for producing a sputtering target which comprises heating at least one rare earth metal and at least one transition metal to produce an amorphous alloy melt, forming a powder of the alloy in an oxygen-free atmosphere, introducing the powdered alloy into a reducing mold, adding a layer of powdered oxygen-getter on top of the powdered alloy, and hot pressing the alloy.

2. The method of claim 1 wherein the heating and all subsequent steps are carried out in an oxygen-free atmosphere.

3. The method of claim 2 wherein the oxygen-free atmosphere is argon.

4. The method of claim 2 wherein the heated rare earth and transition metal alloy melt is melt-spun and crushed to form the alloy powder.

5. The method of claim 4 wherein the powder has an average particle size of from about 45 to about 250 $\mu$m.

6. The method of claim 2 wherein the powdered alloy is introduced into a grafoil-lined mold.

7. The method of claim 6 wherein the grafoil lining has a thickness of from about 10 to about 20 mils.

8. The method of claim 1 wherein the oxygen-getter is selected from the group consisting of mish metal, magnesium, calcium, rare earth metals, titanium, tantalum and mixtures thereof.

9. The method of claim 8 wherein the oxygen-getter is titanium.

10. The method of claim 1 wherein the oxygen-getter has an average particle size of from about 5 to 30 $\mu$m.

11. The method of claim 1 wherein the thickness of the oxygen-getter poured on top of the crushed alloy is from about 2 to about 5 mm.

12. The method of claim 1 wherein the alloy and oxygen-getter are hot-pressed in a vacuum or in an inert gas atmosphere.

13. The method of claim 12 wherein the alloy and oxygen-getter are hot-pressed at an atmospheric pressure of from about 0.01 to about $10^{-6}$ Torr.

14. The method of claim 1 wherein the alloy and oxygen-getter are hot-pressed at from about 1000–3500 Kg/cm$^2$.

15. The method of claim 1 wherein about 10 to 40 atomic % of the rare earth metal is heated with about 90 to 60 atomic % of the transition metal.

16. The method of claim 15 wherein the rare earth-transition metal mixture is comprised of Tb, Fe, and Co.

17. The product of the process of claim 1.

18. The method of claim 1 wherein the alloy powder is formed directly from the melt by atomization or by introducing the melt into liquid nitrogen.

19. The method of claim 1 wherein the alloy powder is introduced into an unlined reducing metal mold.

* * * * *